United States Patent
Accardi et al.

(10) Patent No.: US 10,910,510 B2
(45) Date of Patent: Feb. 2, 2021

(54) ENCAPSULATED FLEXIBLE ELECTRONIC DEVICE, AND CORRESPONDING MANUFACTURING METHOD

(71) Applicant: STMICROELECTRONICS S.R.L., Agrate Brianza (IT)

(72) Inventors: Corrado Accardi, Ragusa (IT); Stella Loverso, Catania (IT); Sebastiano Ravesi, Catania (IT); Noemi Graziana Sparta, Catania (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 523 days.

(21) Appl. No.: 14/984,910

(22) Filed: Dec. 30, 2015

(65) Prior Publication Data
US 2016/0111588 A1 Apr. 21, 2016

Related U.S. Application Data

(62) Division of application No. 13/713,576, filed on Dec. 13, 2012, now abandoned.

(30) Foreign Application Priority Data

Dec. 16, 2011 (IT) .............................. MI2011A2296

(51) Int. Cl.
*H01L 31/18* (2006.01)
*H01L 21/56* (2006.01)
(Continued)

(52) U.S. Cl.
CPC ........ *H01L 31/1876* (2013.01); *G06F 1/1626* (2013.01); *G06F 1/1652* (2013.01);
(Continued)

(58) Field of Classification Search
CPC ..... H01L 23/28; H01L 31/0203; H01L 21/56; H01L 31/1876
See application file for complete search history.

(56) References Cited

U.S. PATENT DOCUMENTS 3,787,212 A 1/1974 Heimsch et al.
5,535,047 A * 7/1996 Hornbeck .......... G02B 26/0841
359/295
(Continued)

FOREIGN PATENT DOCUMENTS

JP 62069566 A 3/1987
JP 06132555 A 5/1994
(Continued)

OTHER PUBLICATIONS

Patrick Abgrall et al 2006 J. Micromech. Microeng. 16 113 (Year: 2006).*
(Continued)

*Primary Examiner* — Sadie White
(74) *Attorney, Agent, or Firm* — Seed IP Law Group LLP

(57) ABSTRACT

The disclosure relates to an encapsulated flexible electronic device comprising a flexible electronic device, wherein the flexible electronic device is protected by a protective coating layer, a first cover sheet and a second cover sheet being made of patterned and developed dry photoresist films. The encapsulated flexible electronic device may be used to directly realize different type of electronic devices, such as smart sensor devices.

19 Claims, 5 Drawing Sheets

(51) Int. Cl.
*H01L 31/048* (2014.01)
*G06F 1/16* (2006.01)
*G06F 3/041* (2006.01)
*H01L 23/28* (2006.01)
*H01L 31/0203* (2014.01)

(52) U.S. Cl.
CPC .............. *G06F 3/041* (2013.01); *H01L 21/56* (2013.01); *H01L 23/28* (2013.01); *H01L 31/0203* (2013.01); *H01L 31/048* (2013.01); *H01L 31/0481* (2013.01); *H01L 2924/0002* (2013.01); *Y02E 10/50* (2013.01)

(56) References Cited

U.S. PATENT DOCUMENTS

| | | | |
|---|---|---|---|
| 5,650,363 | A | 7/1997 | Endroes et al. |
| 6,063,696 | A * | 5/2000 | Brenner ............... H01L 21/78 257/E21.599 |
| 6,171,883 | B1 | 1/2001 | Fan et al. |
| 6,171,885 | B1 * | 1/2001 | Fan ............... H01L 27/14609 257/E27.132 |
| 6,330,464 | B1 | 12/2001 | Colvin, Jr. et al. |
| 2003/0062193 | A1 | 4/2003 | Thaysen et al. |
| 2004/0081402 | A1 | 4/2004 | Ouchi |
| 2004/0101988 | A1 | 5/2004 | Roman, Jr. et al. |
| 2005/0136625 | A1 * | 6/2005 | Henseler ............... B32B 7/06 438/479 |
| 2008/0304821 | A1 * | 12/2008 | Jeung ............... H01L 27/14618 396/529 |
| 2009/0176324 | A1 * | 7/2009 | Tsai ............... H01L 21/56 438/28 |
| 2010/0276716 | A1 * | 11/2010 | Kwon ............... H01L 33/44 257/98 |
| 2011/0074014 | A1 * | 3/2011 | Pagaila ............... H01L 23/5389 257/737 |
| 2011/0241061 | A1 * | 10/2011 | Yu ............... H01L 21/6835 257/99 |
| 2012/0307139 | A1 * | 12/2012 | Cheng ............... G02B 7/02 348/374 |

FOREIGN PATENT DOCUMENTS

| | | |
|---|---|---|
| JP | 2007105647 A | 4/2007 |
| JP | 2007235052 A | 9/2007 |
| JP | 2009282300 A | 12/2009 |

OTHER PUBLICATIONS

N Wangler et al 2011 J. Micromech. Microeng. 21 095009 (Year: 2011).*

Zhao, et al., 2009 International Conference on Electronic Packaging Technology and High Density Packaging (Year: 2009).*

Hopcroft et al., "What is the Young's Modulus of Silicon?," Journal of Microelectromechanical Systems, vol. 19, No. 2, Apr. 2010, pp. 229-238.

Jorgensen et al., "Materials Testing for PV Module Encapsulation," Presented at the National Center for Photovoltaics and Solar Program Review Meeting, Denver, Colorado, Mar. 24-26, 2003, 7 pages.

Kasmawati et al., "Solar Photovoltaic," <http://www.scribd.com/doc/95102850/Solar-Photovoltaics>, uploaded May 29, 2012, 45 pages.

Ketola et al., "Moisture Permeability of Photovoltaic Encapsulants," Solar Power, Jul./Aug. 2010, pp. 28-30.

MicroChem Corporation, "Lithography Overviews, Positive vs. Negative Tone Photoresists," <http://www.microchem.com/Prod-LithographyOverviewPosNeg.htm>, "evidentiary reference" in Office Action dated Jul. 13, 2015, in U.S. Appl. No. 13/713,576, 1 page.

Spanring et al., "High Performance Barrier Films for Next Generation Photovoltaic Module Encapsulation," 33rd IEEE Photovoltaic Specialists Conference, May 11-16, 2008, pp. 1-4.

Thomsen et al., "Flexible Modules of Elongate Solar Cells," 25th European Photovoltaic Solar Energy Conference and Exhibition, Sep. 6-10, 2010, pp. 617-621.

Thomsen et al., "Materials and Manufacturing Processes for High-Efficiency Flexible Phtovoltaic Modules," 35th IEEE Photovoltaic Specialists Conference, Jun. 20-25, 2010, pp. 2877-2882.

Vyas et al., "The global photovoltaic materials market—is the future bright?," Photovoltaics International, Edition 10, Nov. 2010, pp. 49-53.

* cited by examiner

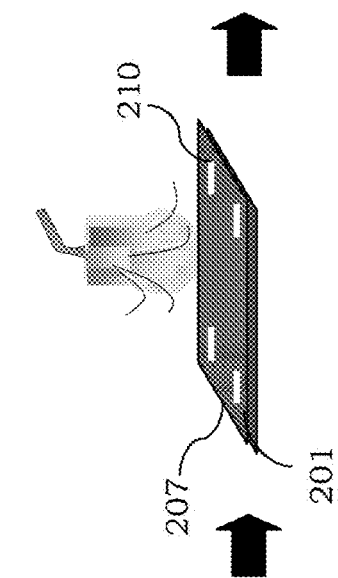
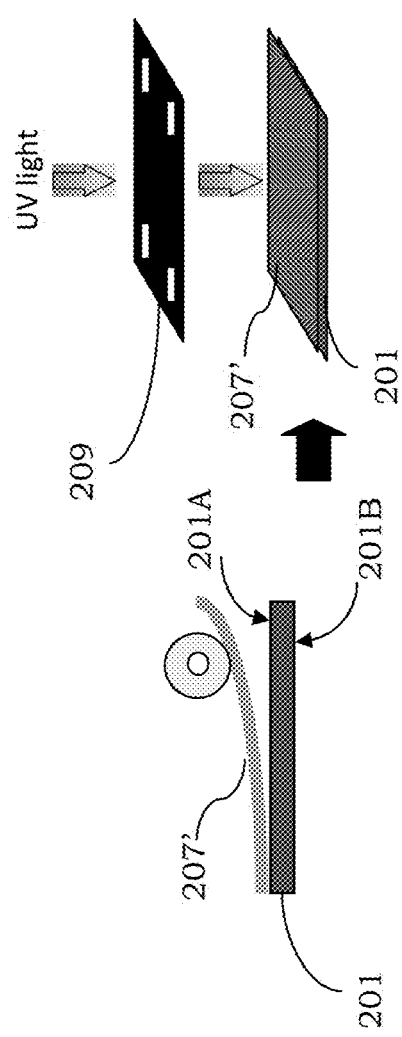
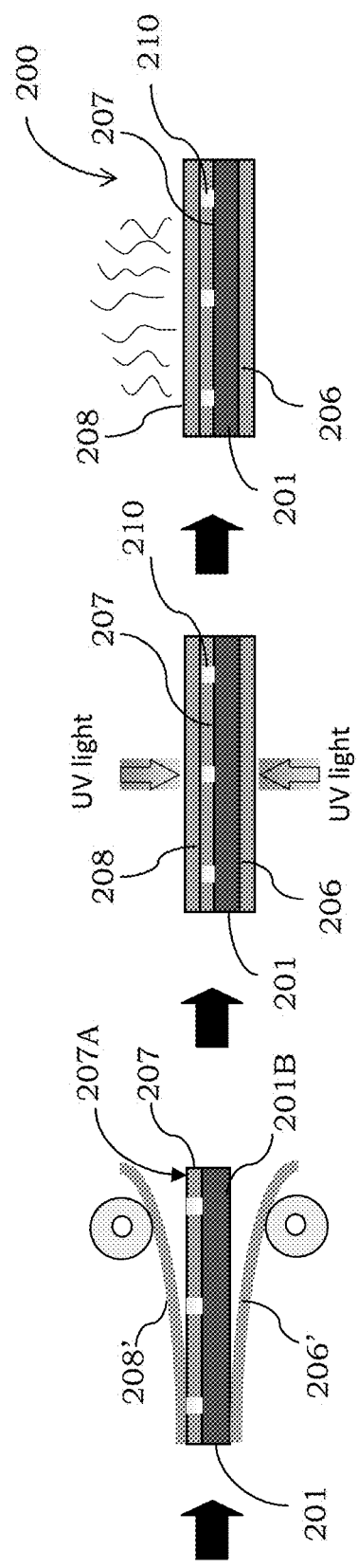
FIG. 5A  FIG. 5B  FIG. 5C
FIG. 5D  FIG. 5E  FIG. 5F

ENCAPSULATED FLEXIBLE ELECTRONIC DEVICE, AND CORRESPONDING MANUFACTURING METHOD

BACKGROUND

1. Technical Field

The present disclosure relates to an encapsulated flexible electronic device.

The disclosure also relates to a method for manufacturing such an encapsulated flexible electronic device.

The disclosure refers, in particular, but not exclusively, to an encapsulated flexible electronic device, such as an encapsulated flexible photovoltaic cell or a touch screen to be used in flexible smart systems, which comprises at least two cover sheets obtained by a dry photoresist film, and the following description is made with reference to this field of application just for explanation convenience.

2. Description of the Related Art

In recent years highly efficient, flexible, lightweight devices, such as photovoltaic cells and modules, have been developed in order to extend the power capabilities of small wireless electronic devices and portable power applications.

In particular, it is well known that, to integrate photovoltaic cells with wireless devices, the cells should be highly efficient, since only a small area may be available for capturing light; the cells should be lightweight and they may need to be flexible.

Moreover, flexible photovoltaic modules have to be protected, usually by a flexible protective packaging formed by materials which are very challenging in terms of transparency, wearability and permeability to gases.

These materials also should have good thermal and thermo-mechanical properties, UV resistance, excellent dimensional stability, insulating properties, and good adhesion to lamination materials, and provide a durable mechanical barrier to the environment. In fact, the materials of bonding adhesives and protective coatings are very important for the long term reliability of the photovoltaic cells, modules, panels and complex installed systems realized by them, such a long term reliability also depending from the application and use conditions.

Standard photovoltaic cells are typically used for outdoor applications, while flexible photovoltaic cells are typically indicated for indoor purposes, such as for clocks, indoor sensor networks, mobile phones, wireless mouse, etc.

It is also notable that indoor illumination has usually a lower level than outdoor illumination. For example, in offices and meeting rooms, the average lighting varies from 300 lux to 750 lux, so that energy harvesting and parameters, such as water absorption, may not be as harsh as for outdoor applications for which the lighting should be usually well over 750 lux.

Moreover, for indoor photovoltaic cells, it is preferable to avoid storage over 70° C. or under −20° C. for long term and also in places where both the temperature and humidity are high, namely over 60° C. and over 80% RH.

For smart systems applications, a flexible device, such as a flexible photovoltaic cell, is one of the components comprised in a foil-based integrated smart system. In particular, a foil-based system comprises a plurality of different foil subsystems with a specific functionality and standardized interfaces between these subsystems.

As an example, a smart flexible system 1 is shown in FIG. 1 and comprises three main sub-systems: an energy subsystem 2 providing autonomous energy to all devices of the system 1; a sensor subsystem 3; and a communication subsystem 4 connected to each other. The system 1 may be autonomous and able to communicate by radio-frequency to an external RF reader in order to transfer, for instance, some measured data to a computer. As an example, the system 1 may be an indoor sensing system needing to harvest energy from light as well as to interact with the ambient to activate the sensing elements. Such a system 1 should be thus able to transmit the results to an external reader connected to a personal computer.

A detailed three-dimensional view of the system 1 is shown in FIG. 2. In particular, the energy subsystem 2 comprises a superior flexible electronic device 5, such as a photovoltaic foil, a battery foil 6 and a first interconnection foil 7 interposed between the photovoltaic foil 5 and the battery foil 6. More in detail, the photovoltaic foil 5 comprises a photovoltaic panel 8, square holes 9 for sensors, a Single Wire Multi-Switch (SWIM) connector 10 that allows microcontroller programming and debugging, a plurality of passive components 11, a battery charger integrated circuit 12, a power management integrated circuit 13 and a plurality of holes 14A for physical inter-connections with the interconnection foil 7, in turn provided with a plurality of holes 14B aligned with the holes 14A of the photovoltaic foil 5 as well as with a plurality of holes 16B of the battery foil 6, in turn aligned with the holes 14A and 14B of the photovoltaic and interconnection foils, 5 and 7. The battery foil 6 is in turn provided with a battery 15.

A second interconnection foil 17 comprising a plurality of holes 18A is interposed, in contact with the battery foil 6, between the energy subsystem 2 and the sensor subsystem 3.

In particular, the sensor subsystem 3 comprises at least a sensors foil 19, in turn including for instance sensors 20, a microcontroller 21 and a plurality of holes 18B, aligned with the holes 18A of the second interconnection foil 17.

The sensor subsystem 3 also comprises a third interconnection foil 23 interposed between the sensors foil 19 and the communication subsystem 4.

The communication subsystem 4 in turn comprises a communication foil 24, which includes for instance an antenna 25, RF transistors 26 and passive components 27. Also the third interconnection foil 23 and the communication foil 24 are provided with respective pluralities of holes, 22A and 22B, aligned with each other and suitable for the physical connection between these foils.

It should be remarked that, according to the structure of the system 1 shown in FIG. 2, the photovoltaic foil 5 acts as an encapsulation foils and protects and passivates the photovoltaic panel 8, allowing, in the same time, its interconnection to the other subsystems 3 and 4.

Moreover, also photovoltaic modules usually contain a plurality of layers from the light facing side to the back. In particular, FIG. 3 schematically shows a structure for a photovoltaic module or cell 100, for instance for outdoor applications.

The photovoltaic cell 100 comprises, in addition to connectors or cables CC, a stack of a back sheet layer 101, usually made in aluminum, an encapsulation layer 102, a metal back contact layer 103, a semiconductor layer 104, a transparent front contact layer 105 and a front sheet layer 106.

It should be underlined that the layers which most largely influence the functioning, longevity and efficiency of photovoltaic modules are represented by the back sheet layer 101, the encapsulation layer 102 and the front sheet layer 106.

More in detail, the material of the front sheet layer 106 usually is glass or a transparent plastic, especially in thin-film modules. Moreover, the encapsulation layer 102 should ensure that the structure of the photovoltaic cell is waterproof and insulated from heat. Finally, the back sheet layer 101 should confer protection to the photovoltaic cell 100 on the back side of the module as a whole and it may be glass, aluminum or plastic.

Nevertheless, for flexible photovoltaic cells, the front sheet layer 106 is formed by transparent polymers and the back sheet layer 101 should be made by flexible polymer material. As an example, some candidate materials for flexible devices are fluoro-polymers, polyester, polyimide, and polycarbonate films, typically supplied in roll form just to make easier the roll to roll processing.

The problem of these standard materials is that many times they are transparent but they are not stable to UV light and not patternable, so that it is not possible to integrate a flexible electronic device, and in particular a photovoltaic module, inside a smart system interconnecting it with others subsystems.

BRIEF SUMMARY

One embodiment of the present disclosure is an encapsulated flexible electronic device able to be interconnected inside a smart system, and a related forming method, having functional and structural characteristics allowing to overcome the limits which still affect the structures and methods previously disclosed with reference to the prior art.

One embodiment of the present disclosure uses a negative tone, transparent and permanent dry photoresist film as a patternable protective coating and cover sheet, namely both a front and a back sheet, in the manufacturing of a flexible electronic device, such as a photovoltaic cell. More in detail, the negative tone, transparent and permanent dry photoresist film is in the form of a thin foil protected by polyethylene terephthalate (PET) on both sides, having a thickness comprised between 15 µm and few hundred microns.

One embodiment of the present disclosure is an encapsulated flexible electronic device that includes a flexible electronic device protected by a protective coating layer, a first cover sheet and a second cover sheet made of a patterned and developed dry photoresist film.

More in particular, the disclosure comprises the following supplemental and optional features, taken alone or in combination when needed.

According to an aspect of the disclosure, the dry photoresist film may be of the negative, transparent and permanent solvent type.

Moreover, according to another aspect of the disclosure, the protective coating layer, the first cover sheet and the second cover sheet may have a modulable thickness.

According to a further aspect of the disclosure, the flexible electronic device may be a flexible photovoltaic cell.

In particular, the flexible photovoltaic cell may comprise a flexible plastic foil, a back electrode, an amorphous silicon layer and a top electrode.

According to another aspect of the disclosure, the flexible electronic device may be a touch screen.

Moreover, according to an aspect of the disclosure, the protective coating layer may be able to define electrical contacts and subsequent metallization of the flexible electronic device.

Furthermore, the first and the second cover sheets may be respectively back and front sheets of the flexible electronic device able to fully protect it from mechanical stress.

Also, according to an aspect of the disclosure, the thicknesses of the protective coating layer, the first cover sheet and the second cover sheet may be between 15 µm and 50 µm.

One embodiment of the present disclosure is a method of manufacturing an encapsulated flexible electronic device comprising a flexible electronic device, the method comprising the steps of:
  providing a flexible electronic device;
  providing a first dry photoresist film on a first surface of the flexible electronic device;
  patterning the first dry photoresist film in a negative form with respect to the flexible electronic device to be obtained;
  developing the first dry photoresist film, obtaining a protective coating layer on the surface of the flexible electronic device;
  providing a second dry photoresist film on a second surface of the flexible electronic device, opposite to the first surface;
  providing a third dry photoresist film on a surface of the protective coating layer;
  patterning the second and third dry photoresist films in a negative form with respect to the encapsulated flexible electronic device to be obtained, so obtaining first and second cover sheets; and
  curing the first and second cover sheets.

According to an aspect of the disclosure, the step of providing the first dry photoresist film may comprise a step of laminating the first dry photoresist film on the first surface of the flexible electronic device.

According to another aspect of the disclosure, the step of patterning the first dry photoresist film may comprise a step of exposing the first dry photoresist film covered by a photolithographic mask shaped in a negative form with respect to the encapsulated flexible electronic device to be obtained.

Moreover, according to yet another aspect of the disclosure, the step of providing the second dry photoresist film may comprise a step of laminating the second dry photoresist film on the second surface of the flexible electronic device being opposite with respect to the first surface and the step of providing the third dry photoresist film may comprise a step of laminating the third dry photoresist film on the surface of the protective coating layer being not in contact with the flexible electronic device.

According to an aspect of the disclosure, the steps of laminating the second and third dry photoresist films may respectively comprise multiple steps of laminating dry photoresist films with different thickness.

Moreover, according to another aspect of the disclosure, the steps of patterning the second and third dry photoresist films may respectively comprise a step of exposing the second and third dry photoresist films covered by a mask, being shaped in a negative form with respect to the encapsulated flexible electronic device to be obtained.

Finally, according to a further aspect of the disclosure, the step of curing the first and second cover sheets may be performed at a temperature of 150-200° C. for 30-60 min.

The characteristics and advantages of encapsulated flexible electronic devices according to the present disclosure and of its manufacturing method will be apparent from the following description of an embodiment thereof given by way of indicative and non-limiting example with reference to the annexed drawings.

BRIEF DESCRIPTION OF THE SEVERAL VIEWS OF THE DRAWINGS

In such drawings:

FIGS. 5A-5F schematically show different steps of a method for manufacturing the photovoltaic cell structure of FIG. 4, according to the present disclosure.

DETAILED DESCRIPTION

Figure 1:
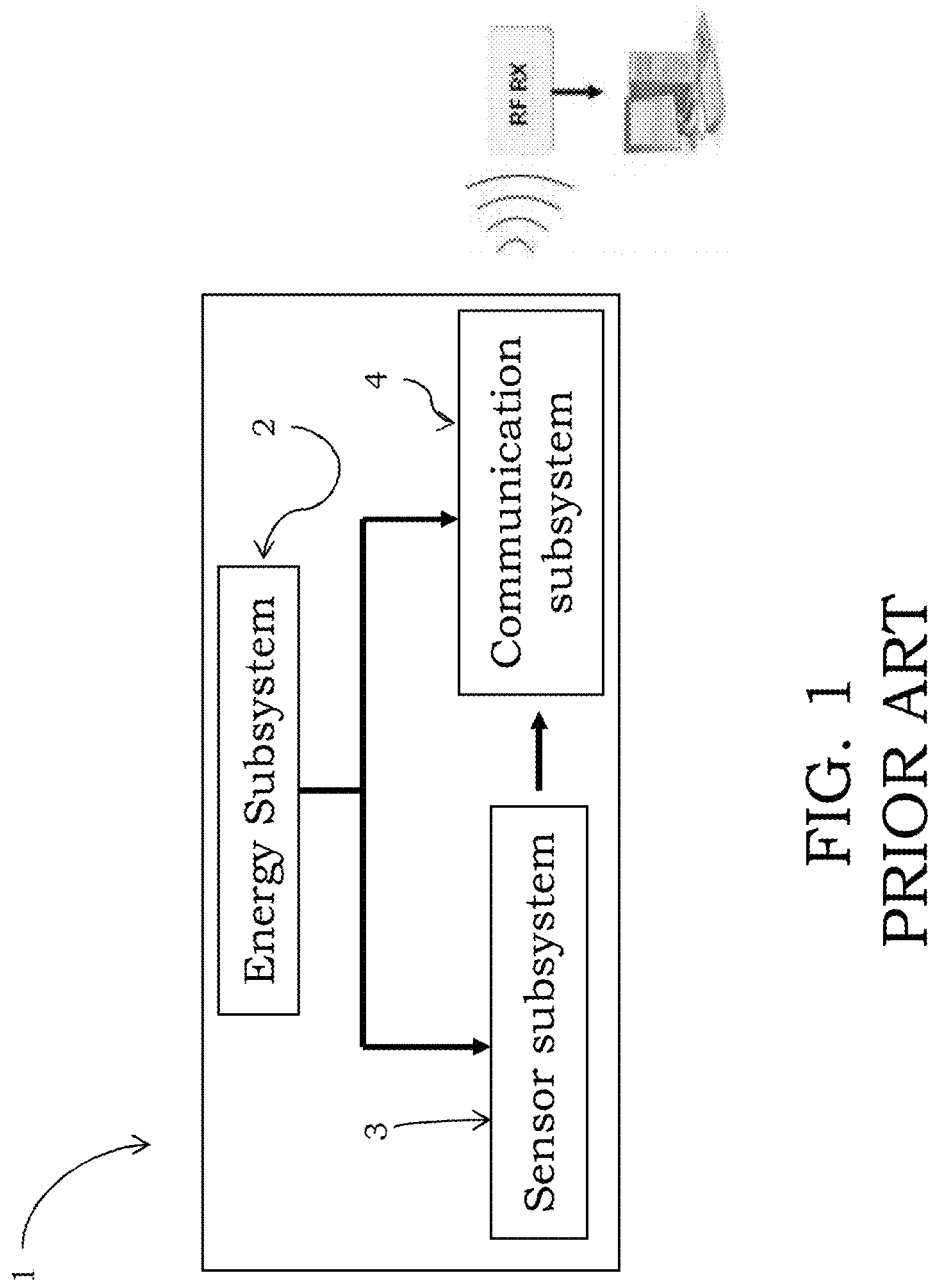
FIG. 1 schematically shows a block diagram of a smart flexible system, according to the prior art.
Figure 2:
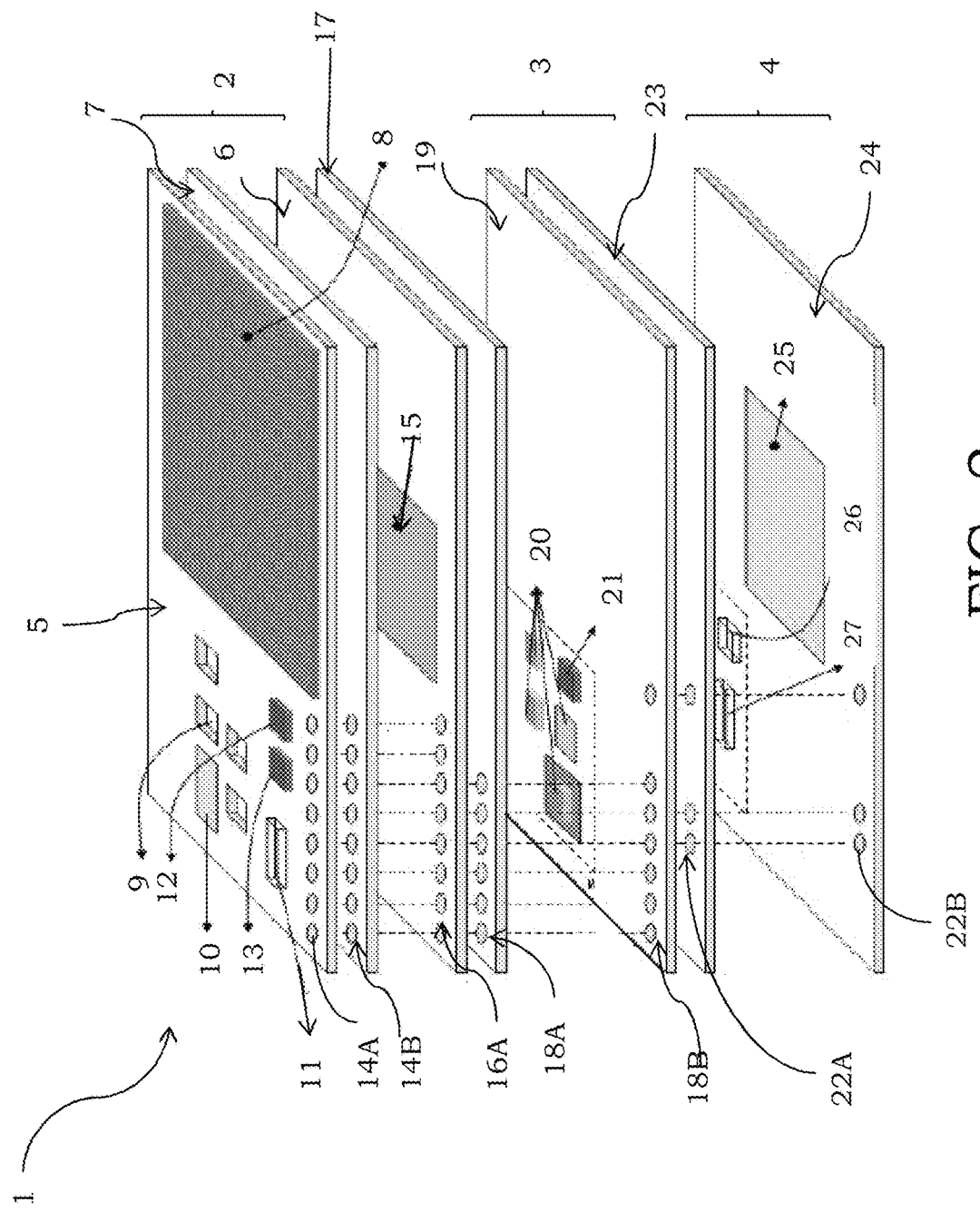
FIG. 2 schematically shows a three-dimensional view of a smart flexible system, according to the prior art.
Figure 3:
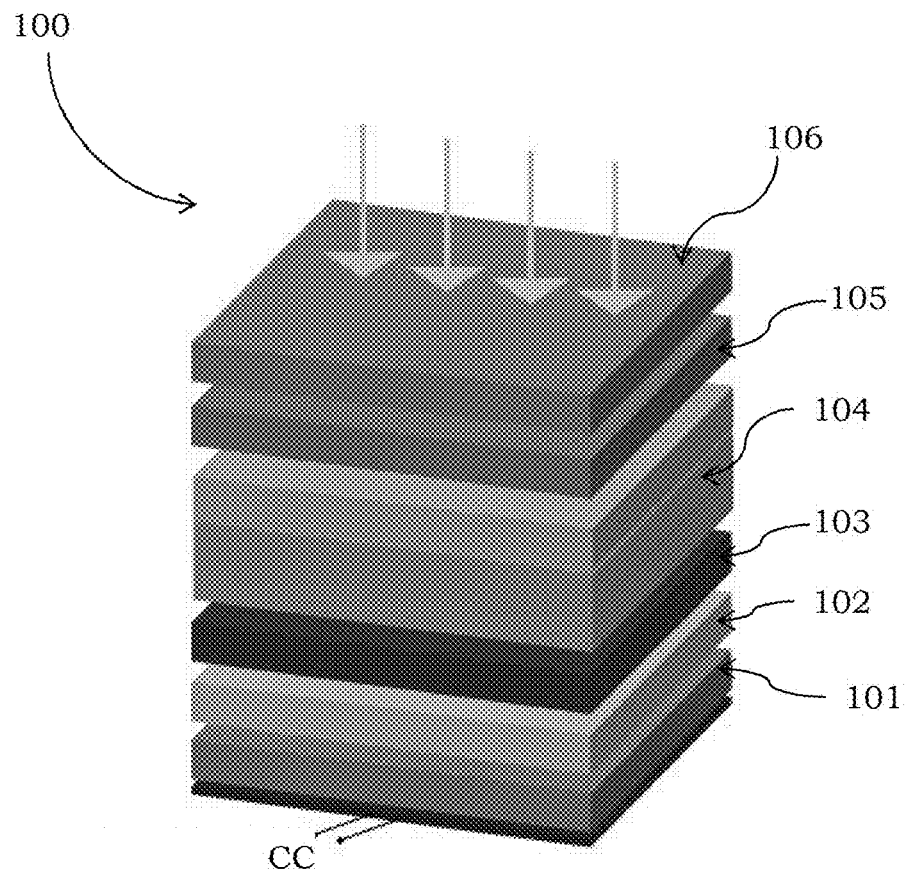
FIG. 3 schematically shows a three-dimensional view of a photovoltaic cell, according to the prior art.
Figure 4:
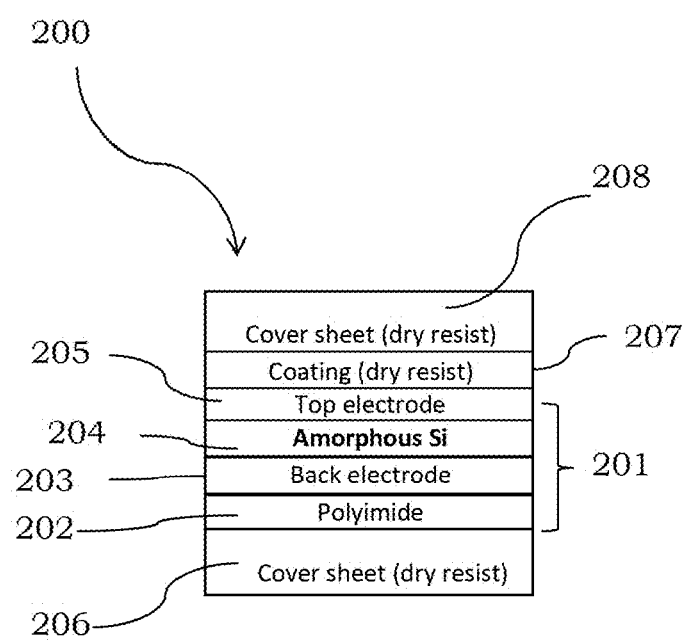
FIG. 4 shows a cross section of a photovoltaic cell structure, being obtained according to the disclosure.

With reference to such figures, and in particular to FIG. 4, a cross section of an encapsulated photovoltaic cell structure 200 is shown.

The encapsulated photovoltaic cell structure 200 comprises a flexible photovoltaic cell 201, in turn including a flexible plastic foil 202, a back electrode 203, an amorphous silicon layer 204 and a top electrode 205.

Moreover, the encapsulated photovoltaic cell structure 200 comprises a first dry resist cover sheet 206, formed under the flexible plastic foil 202, a dry resist coating layer 207, formed on the top electrode 205 and a second dry resist cover sheet 208 formed on the dry resist coating layer 207.

As will be clear from the following description of the method for manufacturing the encapsulated photovoltaic cell structure 200 according to one embodiment, the first and second dry resist cover sheets 206 and 208 are obtained by a dry photoresist film, duly patterned in a negative form with respect to the encapsulated photovoltaic cell structure 200 to be obtained and developed. In particular, the dry photoresist film is thus of the permanent type. Moreover, according to an aspect of the disclosure, the dry photoresist film is of the permanent and transparent type.

It should be noted that the process steps being described hereinafter do not deal with a complete manufacturing process. The present disclosure can be carried out along with the manufacturing techniques of integrated circuit usually employed in the field, and only some process steps of the present method have been described.

Moreover, figures showing schematic views of the integrated structure during the manufacturing are not drawn in scale, being on the contrary drafted so as to emphasize the important features of the disclosure.

According to an aspect of the disclosure, the encapsulated photovoltaic cell structure 200 having the structure shown in FIG. 4 may be substituted by a flexible electronic device, thus obtaining an encapsulated flexible electronic device.

According to an aspect of the disclosure, the flexible electronic device 201 can be a touch screen.

According to another aspect of the disclosure, the flexible plastic foil 202 can be a polyimide layer.

The method of manufacturing an encapsulated flexible electronic device comprising a flexible electronic device, in particular a flexible photovoltaic cell, according to the present disclosure, will be now described with reference to FIGS. 5A-5F.

FIG. 5A shows a flexible photovoltaic cell 201 on which a first dry photoresist film 207' is laminated, in particular on a first surface 201A thereof. As shown in FIG. 5B, the first dry photoresist film 207' is covered with a photolithographic mask 209, for a subsequent exposure to UV light of the first dry photoresist film 207'. In particular, the photolithographic mask 209 is shaped in a negative form with respect to the encapsulated flexible electronic device 200 to be obtained.

FIG. 5C shows a structure obtained after the first dry photoresist film 207' has been duly patterned in a negative form with respect to the final encapsulated photovoltaic cell structure 200 to be obtained and developed, obtaining a protective coating layer 207 on the flexible photovoltaic cell 201. In particular, the protective coating layer 207 is a permanent and transparent type dry photoresist film.

FIG. 5C also shows contacts 210 opened on the protective coating layer 207.

FIG. 5D shows the flexible photovoltaic cell 201, under which a second dry photoresist film 206' is laminated, in particular on a second surface 201B thereof, having the protective coating layer 207 thereon and comprising the contacts 210 duly metalized. A third dry photoresist film 208' is also laminated on the protective coating layer 207, in particular on a flat surface 207A thereof being not in contact with the flexible photovoltaic cell 201.

FIG. 5E shows the encapsulated photovoltaic cell structure 200 comprising the flexible photovoltaic cell 201, the protective coating layer 207 as well as first and second cover sheets 206 and 208, which have been obtained by said second and third dry photoresist films, 206' and 208', respectively, which have been duly patterned in a negative form with respect to the final encapsulated photovoltaic cell structure 200 to be obtained and developed. In particular, the cover sheets 206 and 208 are permanent and transparent type dry photoresist films.

According to an aspect of the disclosure, the protective coating layer 207 is able to define electrical contacts and subsequent metallization of the flexible electronic device 201.

According to an aspect of the disclosure, the first and second cover sheets 206 and 208 are respectively the back and front sheets able to fully protect the flexible photovoltaic cell 201 from mechanical stress to which the final encapsulated photovoltaic cell structure 200 is subject during the manufacturing process, particularly to the dry resist lamination process.

The final encapsulated photovoltaic cell structure 200, as shown in the FIG. 5F, comprises the flexible photovoltaic cell 201 provided with the protective coating layer 207 comprising the contacts 210 and encapsulated between the first cover sheet 206 and the second cover sheet 208, both of them cured at a fixed temperature in the range between 150 and 200° C.

According to an aspect of the disclosure, the thickness of the protective coating layer 207 is able to be modulated. In particular, the protective coating layer 207 has a thickness between 15 µm and 50 µm, preferably 30 µm.

According to an aspect of the disclosure, the thickness of the first cover sheet 206 is able to be modulated. In particular, the first cover sheet 206 has a thickness between 15 µm and 50 µm, preferably 30 µm.

According to an aspect of the disclosure, the thickness of the second cover sheet 208 is able to be modulated. In particular, the second cover sheet 208 has a thickness between 15 µm and 50 µm, preferably 30 µm.

The disclosure relates also to a method for manufacturing an encapsulated flexible electronic device, such as an encapsulated photovoltaic cell structure 200, the method comprising the steps of:

providing a flexible photovoltaic cell 201 as flexible electronic device;

providing a first dry photoresist film 207' on the first surface 201A of the flexible photovoltaic cell 201;

patterning the first dry photoresist film 207' in a negative form with respect to the encapsulated photovoltaic cell structure 200 to be obtained;

developing the first dry photoresist film 207', obtaining a protective coating layer 207 on the first surface 210A of the photovoltaic cell 201;

providing a second dry photoresist film 206' on the second surface 201B of the photovoltaic cell 201 and a third dry photoresist film 208' on the surface 207A of the protective coating layer 207;

patterning the second and third dry photoresist films 206' and 208' in a negative form with respect to the encapsulated photovoltaic cell structure 200 to be obtained so as to realize first and second cover sheets 206 and 208; and curing the cover sheets 206 and 208 thus producing an encapsulated photovoltaic cell structure 200.

The method may also comprise, after the step of developing the first dry photoresist film 207', a step of opening contacts 210 inside the protective coating layer 207 and metalizing the protective coating layer 207.

In one embodiment of the disclosure, the method comprises the formation of a first dry photoresist film as a coating layer on a photovoltaic cell, the first dry photoresist film being duly patterned and developed, and the formation of further second and third dry photoresist films to realize respective cover sheets encapsulating the photovoltaic cell duly coated, the cover sheets being duly exposed and cured.

In particular, the step of providing the first dry photoresist film 207' comprises a step of laminating the first dry photoresist film 207' on the first surface 201A of the photovoltaic cell 201.

Moreover, according to another aspect of the disclosure, the patterning step may comprise exposing the first dry photoresist film 207' covered by a photolithographic mask 209, being shaped in a negative form with respect to encapsulated photovoltaic cell structure 200 to be obtained.

As a skilled person in the art may appreciate, not all the above phases may be strictly necessary for obtaining the final result of the encapsulated photovoltaic cell structure 200.

In addition, the step of providing the second and third dry photoresist films 206' and 208' comprises a step of laminating the second dry photoresist film 206' on the second surface 201B of the photovoltaic cell 201 and the third dry photoresist film 208' on the surface 207A of the protective coating layer 207.

According to an aspect of the disclosure, the laminating step may comprise multiple steps of laminating dry photoresist films having different thickness.

Moreover, according to another aspect of the disclosure, the step of patterning the second and third dry photoresist films 206' and 208' may comprise exposing them covered by a mask, being shaped in a negative form with respect to encapsulated photovoltaic cell structure 200 to be obtained, so as to realize the first and second cover sheets 206 and 208.

According to another aspect of the disclosure, the curing step may comprise curing the cover sheets 206 and 208 at 150-200° C. for 30-60 min.

The advantages of the encapsulated flexible electronic device and of the corresponding manufacturing method emerge clearly from the foregoing discussion.

In particular, advantageously according to the present disclosure, no need is felt of using more than one material to coat or cover the flexible electronic device, in particular a flexible photovoltaic cell.

In addition, advantageously according to the disclosure, it is possible to use the same technique, in particular the photolithographic technique, to pattern the coating material and to laminate the front and back cover sheets and to define front and back electrical contact for metallization.

Another advantage relates to the possibility to roll to roll process large area flexible modules.

In addition, advantageously according to the disclosure, the stress induced by the process flow on the encapsulated flexible electronic device so realized is very low and, in particular, the stress induced by the dry photoresist lamination can be properly modulated using multiple lamination steps of dry photoresist layers, namely a single or multilayer lamination of these dry photoresist layers with different thickness.

Moreover, the whole process is performed in air without steps needing vacuum coating.

Another advantage relates to front and back sheets that can be laminated at the same time, using the same equipment and process flow, the front sheet having also a very good adhesion to the coating layer.

Moreover, the dry photoresist films curing thermal process is compatible with main flexible substrates, such as polyimide, polyethylene terephthalate (PET), polyethylene naphthalate (PEN) and others typically used for photovoltaic (PV) flex cells.

Finally, the process flow described is very fast and simple.

Obviously, a technician of the field, aiming at meeting incidental and specific needs, will bring several modifications to the above described encapsulated flexible electronic device and forming method, all within the scope of protection of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    manufacturing an encapsulated flexible electronic device that includes:
        forming a protective coating layer on and in contact with a first surface of the flexible electronic device;
        forming a first cover sheet on and in contact with a surface of the protective coating layer, the protective coating layer completely separating the first cover sheet from the first surface of the flexible electronic device;
        forming a second cover sheet on and in contact with a second surface of the flexible electronic device; and
        patterning and developing each of the protective coating layer, the first cover sheet; and the second cover sheet, and each of the protective coating layer, the first cover sheet, and the second cover sheet being a dry photoresist film,
    wherein, after the patterning and developing of each of the protective coating layer, the first cover sheet, and the second cover sheet, the protective coating layer is positioned on the first surface of the flexible electronic device, the second cover sheet is positioned on the second surface of the flexible electronic device, and the flexible electronic device is positioned between the protective coating layer and the second cover sheet.

2. The method according to claim 1, wherein:
forming the protective coating layer on the flexible electronic device includes placing a first dry photoresist film on the first surface of the flexible electronic device;
patterning and developing of the protective coating layer includes patterning the first dry photoresist film in a negative form with respect to the flexible electronic device, and developing the first dry photoresist film;
forming the second cover sheet on the flexible electronic device includes placing a second dry photoresist film on the second surface of the flexible electronic device opposite to the first surface;
patterning and developing the second cover sheet includes patterning the second dry photoresist film in a negative form with respect to the flexible electronic device, and curing the second dry photoresist film;
forming the first cover sheet on the protective coating layer includes placing a third dry photoresist film on the surface of the protective coating layer; and
patterning and developing of the first cover sheet includes patterning the third dry photoresist film in a negative form with respect to the flexible electronic device, and curing the third dry photoresist film.

3. The method according to claim 2 wherein placing the first dry photoresist film comprises laminating the first dry photoresist film on the first surface of the flexible electronic device.

4. The method according to claim 2 wherein patterning the first dry photoresist film comprises exposing the first dry photoresist film through a photolithographic mask shaped in a negative form with respect to the flexible electronic device.

5. The method according to claim 2 wherein placing the second dry photoresist film comprises laminating the second dry photoresist film on the second surface of the flexible electronic device, and placing the third dry photoresist film comprises laminating the third dry photoresist film on the surface of the protective coating layer.

6. A method, comprising:
forming an encapsulated electronic device including a first electrode, a second electrode and an amorphous silicon layer between the first electrode and the second electrode, the forming the encapsulated electronic device including:
laminating a first dry photoresist film on and in contact with a first surface of the first electrode of the electronic device;
laminating a second dry photoresist film on second surface of the second electrode of the electronic device, the second surface of the second electrode facing away from the first surface of the first electrode, the electronic device being positioned between the first dry photoresist film and the second dry photoresist film; and
laminating a third dry photoresist film on and in contact with the first dry photoresist film, the third dry photoresist film being completely spaced from the first surface of the first electrode by the first dry photoresist film.

7. The method according to claim 6, comprising exposing the second dry photoresist film and the third dry photoresist film to ultraviolet light.

8. The method according to claim 6, comprising heating the second dry photoresist film and the third dry photoresist film to a fixed temperature that is in a range between 150 and 200° C.

9. The method according to claim 6, comprising forming a pattern in the first dry photoresist film.

10. The method according to claim 9 wherein the first dry photoresist film is a negative tone and transparent dry photoresist film, and forming the pattern in the first dry photoresist film includes exposing the first dry photoresist film to ultraviolet light that passes through a photolithographic mask.

11. The method according to claim 6, comprising forming a plurality of openings in the first dry photoresist film.

12. A method comprising:
forming an encapsulated flexible electronic device including:
placing a first dry photoresist film on and in contact with a first surface of an electronic device of the flexible electronic device;
placing a second dry photoresist film on and in contact with a second surface of the electronic device;
placing a third dry photoresist film on and in contact with the first dry photoresist film, placing the third dry photoresist film including spacing apart the third dry photoresist film entirely from the electronic device by the first dry photoresist film; and
curing the second dry photoresist film and the third dry photoresist film,
wherein, after the curing of the second dry photoresist film and the third dry photoresist film, the first dry photoresist film is positioned on the first surface of the electronic device, the second dry photoresist film is positioned on the second surface of the electronic device, and the electronic device is positioned between the first dry photoresist film and the second dry photoresist film.

13. The method according to claim 12 wherein the first surface of the electronic device is opposite the second surface of the electronic device.

14. The method according to claim 12, comprising forming a plurality of openings in the first dry photoresist film.

15. The method according to claim 12 wherein curing the second dry photoresist film and the third dry photoresist film includes heating the second dry photoresist film and the third dry photoresist film to a fixed temperature that is in a range between 150 and 200° C.

16. The method according to claim 12, comprising exposing the second dry photoresist film and the third dry photoresist film to ultraviolet light.

17. The method according to claim 12, comprising forming a pattern in the first dry photoresist film.

18. The method according to claim 17 wherein the first dry photoresist film is a negative tone and transparent dry photoresist film, and forming the pattern in the first dry photoresist film includes exposing the first dry photoresist film to ultraviolet light that passes through a photolithographic mask.

19. The method according to claim 1 wherein forming the protective coating layer on the first surface of the flexible electronic device, forming the first cover sheet on the surface of the protective coating layer, and forming the second cover sheet on the second surface of the flexible electronic device are respectively performed separately.

* * * * *

UNITED STATES PATENT AND TRADEMARK OFFICE
CERTIFICATE OF CORRECTION

PATENT NO. : 10,910,510 B2  
APPLICATION NO. : 14/984910  
DATED : February 2, 2021  
INVENTOR(S) : Corrado Accardi et al.

Page 1 of 1

It is certified that error appears in the above-identified patent and that said Letters Patent is hereby corrected as shown below:

In the Claims

Column 9, Line 53, Claim 6:
"film on" should read, --film on a--.

Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*